United States Patent
Weimer

(10) Patent No.: US 7,129,128 B2
(45) Date of Patent: Oct. 31, 2006

(54) METHOD OF IMPROVED HIGH K DIELECTRIC-POLYSILICON INTERFACE FOR CMOS DEVICES

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 719 days.

(21) Appl. No.: 09/941,827

(22) Filed: Aug. 29, 2001

(65) Prior Publication Data

US 2003/0042526 A1     Mar. 6, 2003

(51) Int. Cl.
    *H01L 21/8242*     (2006.01)
(52) U.S. Cl. .................. 438/240; 438/769; 438/775
(58) Field of Classification Search .............. 438/3, 438/239, 244, 250, 253, 255, 396–399, 769–770, 438/775–777, 785–786, 791–792, 261, 216, 438/240
See application file for complete search history.

(56) References Cited

U.S. PATENT DOCUMENTS

| | | | |
|---|---|---|---|
| 5,464,783 A * | 11/1995 | Kim et al. ............... 437/42 |
| 5,634,974 A | 6/1997 | Weimer et al. .......... 117/103 |
| 5,688,550 A | 11/1997 | Weimer et al. ............ 427/8 |
| 5,759,262 A | 6/1998 | Weimer et al. ........... 117/88 |
| 5,962,065 A | 10/1999 | Weimer et al. ............ 427/8 |
| 6,033,998 A * | 3/2000 | Aronowitz et al. ....... 438/786 |
| 6,063,698 A | 5/2000 | Tseng et al. ............. 438/585 |
| 6,087,229 A | 7/2000 | Aronowitz et al. ....... 438/287 |
| 6,124,164 A | 9/2000 | Al-Shareef et al. ...... 438/240 |
| 6,146,959 A | 11/2000 | DeBoer et al. .......... 438/393 |
| 6,162,744 A | 12/2000 | Al-Shareef et al. ...... 438/785 |
| 6,198,124 B1 | 3/2001 | Sandhu et al. .......... 257/310 |
| 6,207,587 B1 | 3/2001 | Li et al. ................ 438/769 |
| 6,218,256 B1 * | 4/2001 | Agarwal ................ 438/393 |
| 6,235,571 B1 | 5/2001 | Doan ................... 438/240 |
| 6,238,964 B1 * | 5/2001 | Cho .................... 438/240 |
| 6,245,652 B1 | 6/2001 | Gardner et al. ......... 438/592 |
| 6,245,689 B1 | 6/2001 | Hao et al. ............. 438/769 |
| 6,278,166 B1 | 8/2001 | Ogle, Jr. .............. 257/411 |
| 6,291,868 B1 | 9/2001 | Weimer et al. ......... 257/413 |
| 6,362,086 B1 | 3/2002 | Weimer et al. ......... 438/591 |
| 6,410,968 B1 | 6/2002 | Powell et al. .......... 257/412 |
| 6,475,883 B1 | 11/2002 | Powell et al. .......... 438/486 |
| 6,548,368 B1 | 4/2003 | Narwankar et al. ...... 438/398 |
| 6,893,979 B1 * | 5/2005 | Khare et al. ........... 438/769 |
| 2001/0024853 A1 * | 9/2001 | Wallace et al. ......... 438/240 |

\* cited by examiner

*Primary Examiner*—Thanhha S. Pham
(74) *Attorney, Agent, or Firm*—Whyte Hirschboeck Dudek SC

(57) ABSTRACT

Methods for forming dielectric layers over polysilicon substrates, useful in the construction of capacitors and other semiconductor circuit components are provided. A self-limiting nitric oxide (NO) anneal of a polysilicon layer such as an HSG polysilicon capacitor electrode, at less than 800° C., is utilized to grow a thin oxide (oxynitride) layer of about 40 angstroms or less over the polysilicon layer. The NO anneal provides a nitrogen layer at the polysilicon-oxide interface that limits further oxidation of the polysilicon layer and growth of the oxide layer. The oxide layer is exposed to a nitrogen-containing gas to nitridize the surface of the oxide layer and reduce the effective dielectric constant of the oxide layer. The process is particularly useful in forming high K dielectric insulating layers such as tantalum pentoxide over polysilicon. The nitridized oxynitride layer inhibits oxidation of the underlying polysilicon layer in a post-treatment oxidizing anneal of the high K dielectric, thus maintaining the oxide layer as a thin layer over the polysilicon layer.

127 Claims, 3 Drawing Sheets

METHOD OF IMPROVED HIGH K DIELECTRIC-POLYSILICON INTERFACE FOR CMOS DEVICES

FIELD OF THE INVENTION

The present invention relates generally to semiconductor fabrication and, more particularly, to dielectric layers used in semiconductor fabrication, and to methods of forming capacitors and semiconductor circuit components.

BACKGROUND OF THE INVENTION

The continuing trend in integrated circuits toward densification has led to reduced device dimensions and a decrease in size of components that make up the devices. However, in the fabrication of such devices as MOS transistors (metal-oxide semiconductors, or MIS or metal-insulating semiconductors), and with the trend toward higher performance and processing speeds, storage cells must maintain a minimum storage charge to ensure operation of memory cells. Several techniques have been developed to increase the storage capacity of a capacitor within a limited space. For example, surface area has been increased by forming the capacitor in a trench or as a stacked structure. The surface area of the capacitor has also been achieved by increasing the surface roughness of the lower electrode that forms the storage node.

Other techniques concentrate on the use of dielectric materials having high dielectric constants (k). Such materials include tantalum pentoxide ($Ta_2O_5$), titanium dioxide ($TiO_2$), and barium strontium titanate (BST). Such materials effectively possess dielectric constants greater than conventional dielectrics (e.g., silicon oxides and nitrides). Due to the high dielectric constant of $Ta_2O_5$ and other high K dielectrics, a thicker dielectric layer can be used in capacitor constructions to achieve the same capacitance level as thinner layers of other lower K dielectric materials, thus reducing cell leakage for the same effective oxide thickness (EOT).

Despite the advantages of high dielectric constant materials, difficulties have been encountered, however, in incorporating insulating inorganic metal oxide materials into semiconductor fabrications. Typically, the deposition of the dielectric layer and a subsequent anneal to densify the high K dielectric material to reduce leakage is conducted in the presence of an oxygen ambient. Undesirably, the oxygen ambient will react with the underlying lower capacitor plate, typically conductively doped polysilicon, to form a layer of silicon dioxide over the polysilicon that reduces the overall dielectric constant and thereby reduces the cell capacitance.

One solution that has been utilized is to provide an intervening oxidation barrier layer between the inorganic metal oxide dielectric layer and the underlying polysilicon electrode. Present methods include forming a silicon nitride layer over the polysilicon prior to formation of the $Ta_2O_5$ or other dielectric layer, by rapid thermal nitridization (RTN) of the polysilicon electrode. The nitride layer is used to reduce the oxidation of the lower polysilicon electrode during the deposition of the dielectric layer and subsequent oxidation and conditioning treatments. The subsequent treatment processes invariably oxidize the underlying polysilicon electrode to reduce the leakage of the dielectric-polysilicon stack. However, the overall capacitance is undesirably reduced due to the physical thickness of the subsequent oxynitride layer, which is typically up to 30 angstroms.

Thus, a need exists for a process for integrating high dielectric constant materials into semiconductor devices that avoids such problems.

SUMMARY OF THE INVENTION

The present invention provides methods for forming dielectric layers over polysilicon substrates and in the construction of semiconductor devices, methods for forming capacitors and other semiconductor devices, and semiconductor devices and capacitor structures.

It is recognized that the lower polysilicon electrode of a capacitor construction should become oxidized to some degree during processing for reduction of cell leakage. The present invention utilizes a self-limiting oxynitride layer to achieve polysilicon oxidation, and as an interface layer prior to deposition of $Ta_2O_5$ or other dielectric layer. The process flow of the invention utilizing a self-limiting nitric oxide (NO) anneal of the polysilicon layer at less than 800° C. to grow a thin oxide (oxynitride) layer of about 40 angstroms or less, preferably less than 15 angstroms, over the polysilicon layer. The anneal results in the formation of a layer of nitrogen at the polysilicon-oxide interface that inhibits oxygen diffusion through the oxide layer to the underlying polysilicon, thus inhibiting further oxidation of the polysilicon layer and additional growth of the oxide layer. The oxide layer is then annealed, preferably plasma annealed, in a nitrogen-containing ambient to nitridize the surface of the oxide layer, resulting in layer of silicon nitride ($SiN_x$) formed over the oxide layer. The silicon nitride layer reduces the effective dielectric constant of the oxide layer.

Advantageously, the thickness of an oxide layer grown over polysilicon with nitric oxide and overlain with tantalum pentoxide or other high K dielectric that is subsequently reoxidized is less than the thickness of an oxide layer grown over polysilicon by conventional RTN with a reoxidized high K dielectric layer. By use of the present invention, a post-treatment oxidation anneal of a high K dielectric layer will not oxidize the underlying polysilicon layer to any substantial degree.

In addition, the process of the invention results in reduced electrical thickness of the interface layer in a capacitor construction, and thus increased capacitance without adversely affecting the leakage (defectivity) of the stack. The present process achieves more capacitance with the same or reduced leakage (cell defects). The process further provides reduced Dt of the entire process flow by replacing the conventional 750° C. anneal in nitrous oxide ($N_2O$) for crystallization of the dielectric (e.g., $Ta_2O_5$) layer with a shorter 700 to 750° C. anneal of the polysilicon layer in nitric oxide (NO).

In one aspect, the invention provides methods for forming a dielectric layer over a polysilicon substrate. The polysilicon substrate is annealed in nitric oxide (NO) to form an oxide (oxynitride) layer, the oxide layer is nitridized to form a nitride layer, and the dielectric layer is deposited onto the nitride layer. In one embodiment of the method, the polysilicon substrate such as HSG polysilicon, is annealed in nitric oxide at a temperature of less than 800° C., preferably about 700° C. to about 750° C. to form an oxynitride layer, preferably an active nitrogen-containing species formed in a plasma, of about 40 angstroms or less, preferably less than 15 angstroms. The oxynitride layer is then exposed to a nitrogen-containing gas, preferably a plasma source of nitrogen, to form a silicon nitride layer over the surface. A high K dielectric layer such as tantalum pentoxide ($Ta_2O_5$) is then formed over the nitride layer, and annealed in an oxidizing gas. The thickness of the oxynitride layer remains substantially the same as before the oxidizing anneal of the dielectric layer.

In another aspect, the invention provides methods for forming a semiconductor device above a semiconducting substrate. In one embodiment of the method, an oxynitride layer is formed over a polysilicon substrate by annealing the polysilicon substrate in the presence of a nitric oxide, preferably at a temperature of less than 800° C. to form an oxide layer of about 40 angstroms or less with a preferred thickness of less than 15 angstroms; nitridizing the oxide layer in a nitrogen-containing gas; and forming a dielectric layer over the nitrided surface of the oxide layer, preferably with a high K dielectric such as tantalum pentoxide ($Ta_2O_5$) which is then subjected to an oxidizing anneal to condition the material.

In yet another aspect, the invention provides methods for forming a capacitor. In one embodiment of the method, a first capacitor electrode comprising polysilicon is formed over a substrate, an oxide (oxynitride) layer is grown over the first capacitor electrode by annealing the electrode in the presence of a nitric oxide, preferably at a temperature of less than 800° C., to a thickness of about 40 angstroms or less, with a preferred thickness of less than 15 angstroms; the oxide layer is exposed to a nitrogen-containing gas to form a nitride layer over the surface; and a dielectric layer is formed over the nitride layer, preferably using a high K dielectric such as tantalum pentoxide ($Ta_2O_5$) which is then annealed in an oxidizing gas. A conductive second capacitor electrode can then be formed over the dielectric layer.

In another embodiment, a capacitor can be formed by providing a substrate comprising an overlying insulative layer and a container opening formed in the insulating layer to an active area on the substrate and a lower electrode comprising polysilicon formed within the container opening; growing an oxide (oxynitride) layer over the lower electrode to a thickness of about 40 angstroms or less, with a preferred thickness of less than 15 angstroms, by annealing the polysilicon electrode in the presence of nitric oxide; nitridizing the oxide layer in a nitrogen-containing gas; and forming a layer of a dielectric material, preferably a high K dielectric, over the nitridized oxide layer. A conductive upper electrode can then be formed over the dielectric layer.

In another aspect, the invention provides a semiconductor device. In one embodiment, the device comprises an oxynitride layer overlying a polysilicon substrate, the oxynitride layer comprising a nitric oxide grown oxide layer of up to about 40 angstroms, with a preferred thickness of less than 15 angstroms; a layer of silicon nitride overlying the oxynitride layer; and a layer of a dielectric material, preferably a high K dielectric that has been oxygen annealed, overlying the nitride layer.

In yet another aspect, the invention provides a capacitor. In one embodiment, the capacitor comprises a first conductive capacitor plate comprising polysilicon; a thin oxynitride layer overlying the first capacitor plate, the oxynitride layer comprising an oxide layer grown in the presence of nitric oxide, having a thickness of about 40 angstroms or less, preferably less than 15 angstroms; a layer of silicon nitride overlying the oxynitride layer; and a dielectric layer overlying the nitride layer, preferably comprising an oxygen annealed high K dielectric material. Additionally, the capacitor can comprise a second conductive capacitor plate overlying the dielectric layer.

In another embodiment, the capacitor can comprise a container formed in an insulative material such as BPSG, and a lower capacitor electrode comprising polysilicon such as HSG polysilicon formed in the container; an oxide (oxynitride) layer overlying the lower capacitor electrode, and comprising nitric oxide grown oxide of about 40 angstroms or less, preferably less than 15 angstroms thick; a silicon nitride layer over the surface of the oxide layer; and a dielectric layer, preferably an oxidized high K dielectric, overlying the nitride layer. The capacitor can further comprise an upper capacitor electrode overlying the dielectric layer.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

An embodiment of a method of the present invention is described with reference to FIGS. 1–5, in a method of forming a dielectric layer in the construction of a container capacitor. While the concepts of the invention are conducive to the fabrication of container capacitors, the concepts described herein can be applied to other semiconductor devices that would likewise benefit from the fabrication of a dielectric film as described herein. Therefore, the depiction of the invention in reference to the manufacture of a container capacitor is not meant to limit the extent to which one skilled in the art might apply the concepts taught herein.

Figure 1:
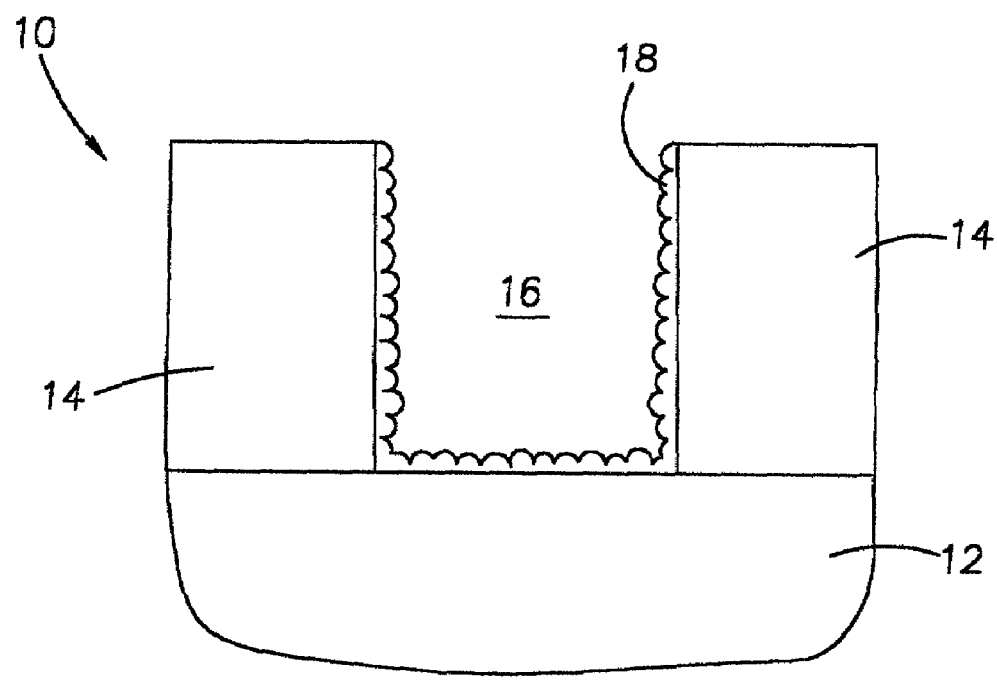
FIG. 1A is a diagrammatic cross-sectional view of a semiconductor wafer fragment at a preliminary step of a processing sequence.

Referring to FIG. 1, a portion of a semiconductor wafer 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as comprising a substrate 12 and an overlying insulation layer 14. An exemplary substrate 12 is monocrystalline silicon that is lightly doped with a conductivity enhancing material. Exemplary insulation materials include silicon dioxide ($SiO_2$), phosphosilicate glass (PSG), borosilicate glass (BSG), and borophosphosilicate glass (BPSG), in a single layer or multiple layers, with the insulation layer 14, being BPSG in the illustrated example. A container or opening 16 has been conventionally etched into the BPSG insulation layer 14.

An electrically conductive material forms a lower capacitor electrode layer 18 that has been formed on the insulative substrate 14 within the opening 16. The electrode layer 18 comprises a semiconductive material such as HSG polysilicon, and undoped or conductively doped polysilicon, being HSG polysilicon in the illustrated example. The electrode layer 18 can be formed by conventional fabrication methods known and used in the art.

Figure 2:
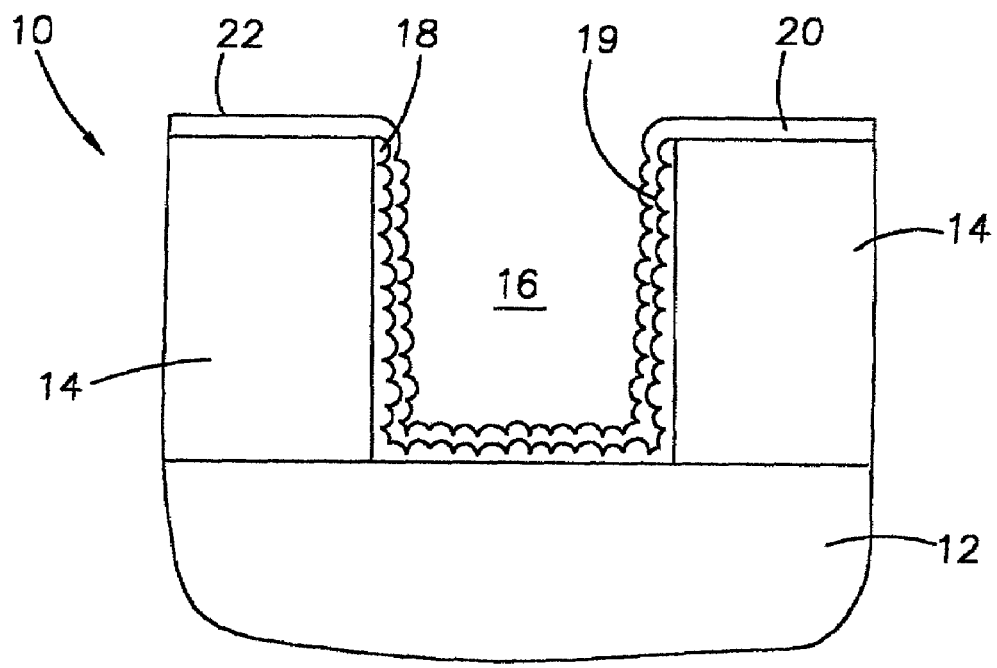
FIGS. 2–5 are views of the wafer fragment of FIG. 1 at subsequent and sequential processing steps, showing fabrication of an capacitor according to an embodiment of the method of the invention.

Referring now to FIG. 2, a thin oxide (oxynitride) layer 20 is thermally grown over the polysilicon electrode layer 18 using a self-limiting anneal of the electrode layer 18 in nitric oxide (NO) gas. As the oxide layer 20 builds up, the underlying polysilicon electrode layer 18 is no longer oxidizable and the nitric oxide ambient thus becomes a self-limiting oxidation ambient. The annealing localizes nitrogen near the interface 19 between the polysilicon layer 18 and the oxide layer 20. The resulting thin nitrogen layer at the polysilicon-oxide interface inhibits diffusion of oxygen through the oxide layer 20 into the underlying polysilicon layer 18, thus preventing further oxidation of the polysilicon layer during subsequent processing steps, i.e., a post-RPN (plasma anneal). A preferred technique for forming the oxide layer 20 is to expose the polysilicon layer 18 to nitric oxide (NO) gas at a temperature of less than 800° C., preferably about 700 to about 750° C., for about 1 to about 3600 seconds, at about 1 mTorr to greater than atmospheric pressure, preferably atmospheric pressure, to grow a thin oxide layer 20 that is about 40 angstroms or less, and preferably less than 15 angstroms.

Figure 3:
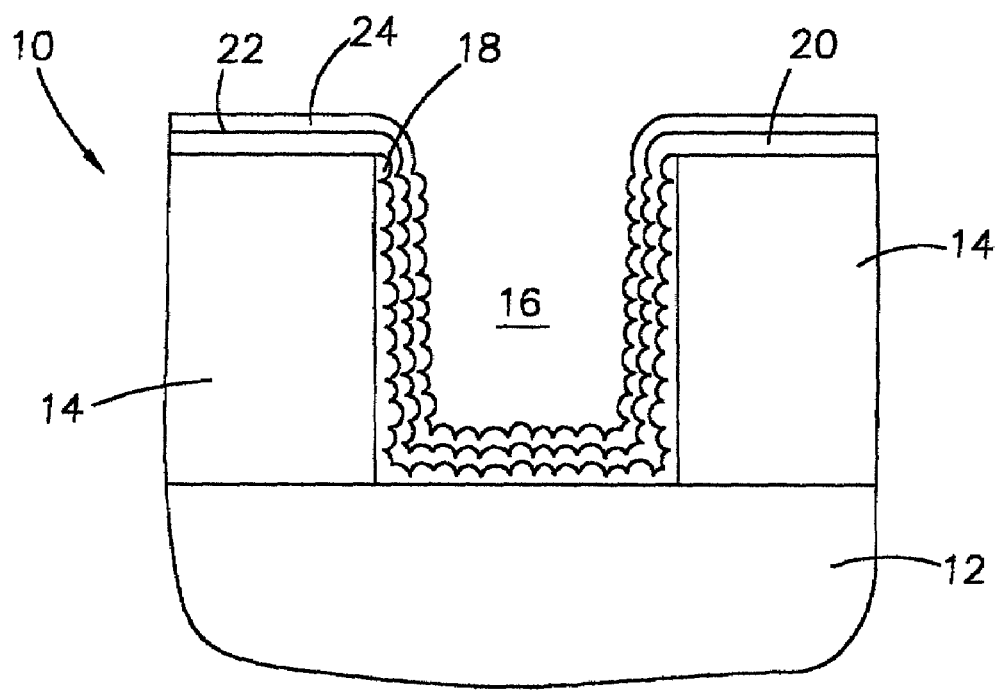

The oxide layer 20 is then exposed to a plasma generated nitrogen species to form a nitrogen-containing layer 24, as shown in FIG. 3. The nitride layer 24 on the surface of the oxide layer 20 reduces the effective dielectric constant of the oxide layer 20. Preferably, the nitride layer 24 is about 5 to about 15 angstroms thick, preferably about 10 angstroms, and the oxide layer 20 and the nitride layer 24 collectively have a physical thickness of about 10 to about 40 angstroms, preferably about 10 to about 30 angstroms, preferably about 15 angstroms.

The nitridizing process step can occur in a rapid thermal processor or, preferably, a plasma reactor such as a high density plasma reactor or remote plasma chamber, typically over a temperature range of about 0 C. to about 900° C. Exemplary nitrogen-containing gases include nitrogen ($N_2$), ammonia ($NH_3$), nitrogen ($N_2$) with helium (He), nitrogen ($N_2$) with argon (Ar), nitrogen oxides ($NO_x$) including nitrous oxide and nitric oxide, and mixtures thereof.

A preferred nitridization process comprises exposing the wafer 10 to an remote plasma source of nitrogen, preferably a microwave source, at a temperature of about 350 to about 900° C., a pressure of about 100 Torr to about 100 Torr, preferably about 1 to about 10 Torr, with a microwave generated plasma in nitrogen ($N_2$) and helium at a He:N ratio of about 4:1, and at a flow rate of the nitrogen-containing gas of about 1 to about 5000 sccm, for about 1 to 1800 seconds.

Figure 4:
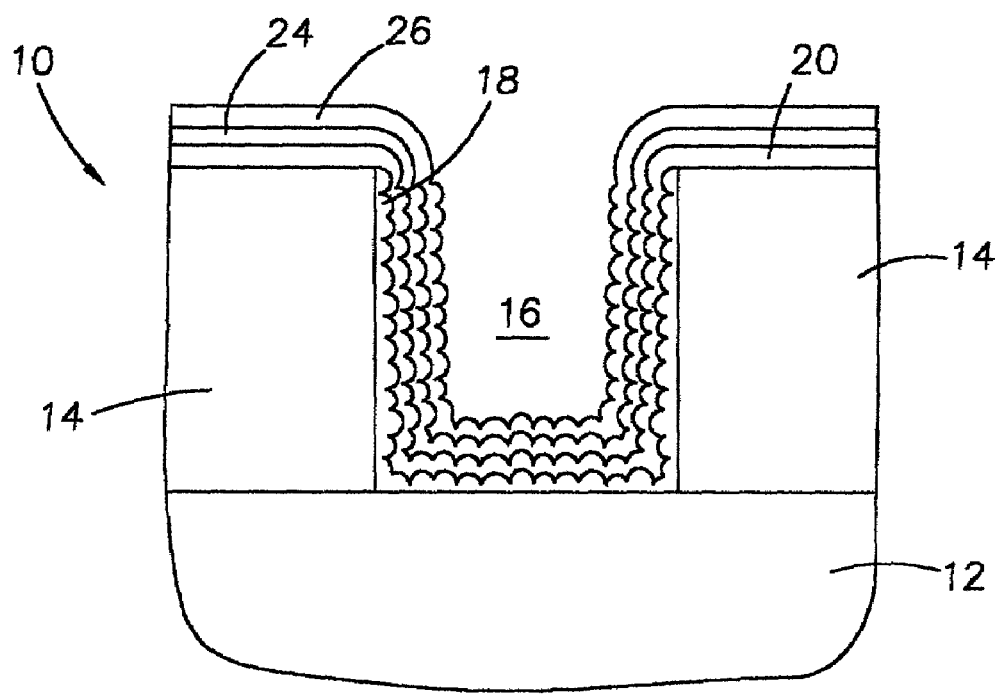

Following nitridization, a dielectric layer 26 is then formed over the nitride layer 24, as depicted in FIG. 4, according to techniques known and used in the art. Preferably, the dielectric layer 26 comprises a high dielectric constant (high K) material. "High K" materials are to be distinguished from conventional dielectric materials such as silicon dioxide (k~3.9). Examples of high K materials for dielectric layer 26 include tantalum pentoxide ($Ta_2O_5$), titanium dioxide ($TiO_2$), barium strontium titanate (BST), strontium titanate (ST), barium titanate (BT), lead zirconium titanate (PZT), strontium bismuth tantalate (SBT), hafnium oxide ($HfO_2$), zirconium oxide ($ZrO_2$), and aluminum oxide ($Al_2O_3$), being $Ta_2O_5$ in the illustrated example. The dielectric layer 26 can be formed by a variety of techniques known and use in the art such as low pressure chemical vapor deposition (LPCVD), remote plasma deposition, among other techniques.

Subsequently, the high K ($Ta_2O_5$) layer 26 can be subjected to post-treatment processing to reduce leakage and improve its dielectric qualities by saturating the layer 26 with oxygen. Typically, $Ta_2O_5$ is subjected to an anneal in the presence of an oxidizing gas. The oxygen anneal is typically conducted utilizing one or more of oxygen ($O_2$), plasma oxygen, ozone ($O_3$) and nitrous oxide ($N_2O$), with or without plasma excitation.

In a conventional process flow, post-treatment processing of the dielectric layer 26 in an oxygen ambient would undesirably oxidize the underlying polysilicon layer 18. However, the presence of the oxide layer 20 and the silicon oxynitride layer 24 according to the invention, provides the benefit of providing a nitrogen barrier to diffusion of oxygen through the oxide layer 20 to the polysilicon layer 18 during post treatment oxidation of the dielectric layer 26.

Figure 5:
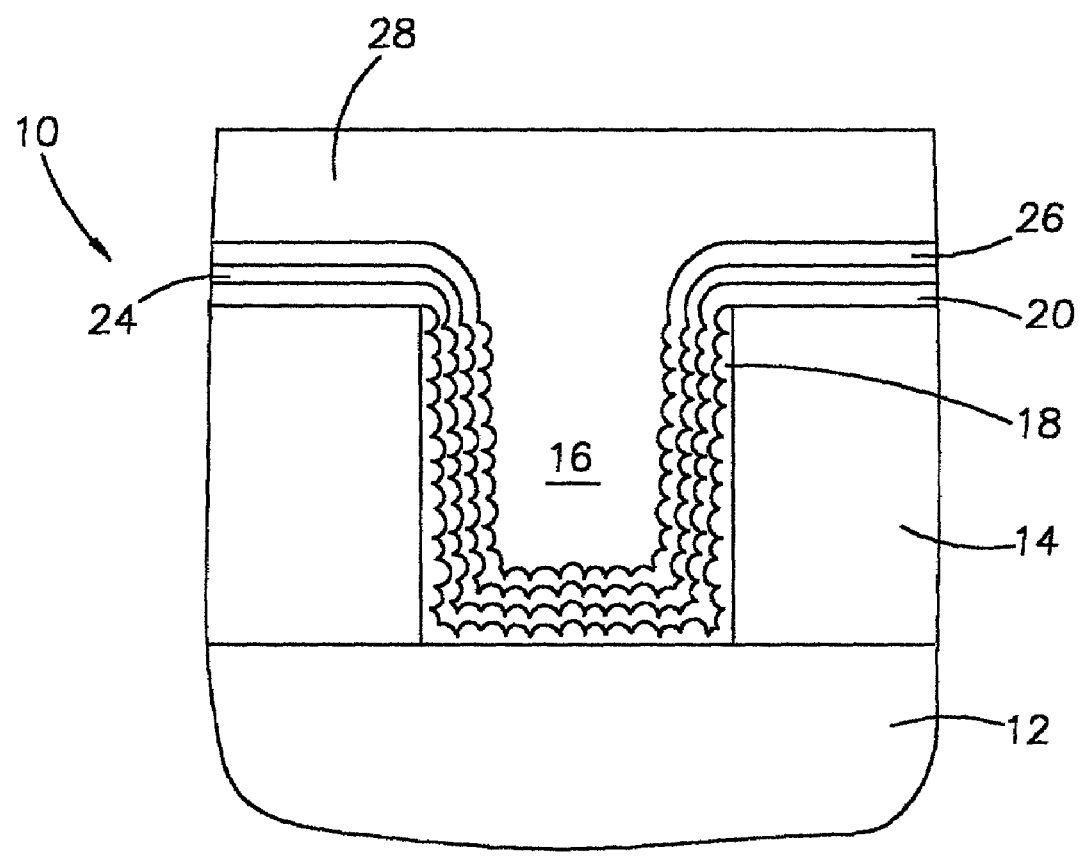

Referring now FIG. 5, a conductive material is then deposited over the dielectric layer 26 to form the top capacitor electrode (plate) 28 and complete the capacitor structure. The top electrode 28 can be formed by conventional techniques from a conductive material such as doped polysilicon or a conductive metal such as tungsten, tungsten nitride, titanium nitride, and platinum. The conductive material can be deposited on the dielectric layer 26 by conventional methods, such as CVD, or physical vapor deposition (e.g., sputtering) for a metal plate, to complete the capacitor structure.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of fanning a dielectric layer, comprising the steps of:
    annealing a polysilicon substrate in nitric oxide to form an oxide layer on the polysilicon substrate;
    nitridizing the oxynitride layer to form a nitride layer on the oxide layer by exposure of the oxide layer to a plasma mixture of nitrogen and helium or nitrogen and argon; and
    depositing the dielectric layer onto the nitride layer.

2. The method of claim 1, wherein the polysilicon substrate comprises a polysilicon selected from the group consisting of doped polysilicon, undoped polysilicon, and HSG polysilicon.

3. The method of claim 1, wherein the oxide layer is about 40 angstroms or less.

4. The method of claim 1, wherein the oxide layer is less than 15 angstroms thick.

5. A method of forming a dielectric layer, comprising the steps of:
   annealing a polysilicon substrate in nitric oxide at a temperature of less than 800° C. to form an oxynitride layer on the polysilicon substrate;
   nitridizing the oxynitride layer to form a nitride layer on the oxide layer by exposure of the oxynitride layer to a plasma mixture of nitrogen and helium or nitrogen and argon; and
   depositing the dielectric layer onto the nitride layer.

6. The method of claim 5, wherein the step of annealing the polysilicon substrate is at a temperature of about 700 to about 750° C.

7. The method of claim 5, wherein the step of nitridizing the oxynitride layer is at a temperature of up to about 900° C.

8. The method of claim 5, wherein the oxynitride layer and the nitride layer have a combined thickness of about 10 to about 40 angstroms.

9. The method of claim 5, wherein the dielectric layer comprises a high K dielectric.

10. The method of claim 9, wherein the dielectric layer comprises the high K dielectric selected from the group consisting of tantalum pentoxide, titanium dioxide, barium strontium titanate, strontium titanate, barium titanate, lead zirconium titanate, strontium bismuth tantalate, hafnium oxide, zirconium oxide, and aluminum oxide.

11. The method of claim 9, wherein the dielectric layer comprises tantalum pentoxide.

12. The method of claim 5, further comprising, after the step of depositing the dielectric layer, annealing the dielectric layer in an oxidizing gas.

13. The method of claim 12, wherein the oxidizing gas is selected from the group consisting of oxygen, plasma oxygen, ozone, nitrous oxide, and mixtures thereof.

14. The method of claim 12, wherein the oxidizing gas comprises a plasma oxygen.

15. The method of claim 12, wherein the oxynitride layer has a thickness that is substantially the same before and after the step of annealing the dielectric layer.

16. The method of claim 5, wherein the polysilicon substrate comprises HSG polysilicon.

17. The method of claim 5, wherein the polysilicon substrate is situated within an opening in an insulative layer.

18. The method of claim 5, further comprising, prior to the step of annealing the polysilicon substrate, forming an opening in an insulative layer, and forming the polysilicon substrate as a fill within the opening.

19. The method of claim 5, further comprising, prior to the step of annealing the polysilicon substrate, forming the polysilicon substrate over a substrate.

20. The method of claim 19, wherein the polysilicon substrate comprises a capacitor electrode.

21. The method of claim 5, further comprising, prior to the step of annealing the polysilicon substrate, providing a substrate comprising an overlying insulative layer, an opening formed in the insulating layer, and the polysilicon substrate formed as a fill within the opening.

22. The method of claim 5, further comprising, prior to the step of annealing the polysilicon substrate, providing a substrate with an overlying insulative layer and one or more openings in the insulative layer extending to the substrate, and the polysilicon substrate as a fill within the one or more openings.

23. The method of claim 5, further comprising, prior to the step of annealing the polysilicon substrate, providing a substrate comprising an opening, and forming the polysilicon substrate as a first conductive electrode layer within the opening, the polysilicon substrate comprising hemispherical grain polysilicon.

24. The method of claim 23, further comprising forming a second conductive electrode layer over the dielectric layer.

25. The method of claim 24, wherein the second conductive electrode layer comprises a conductive metal.

26. The method of claim 25, wherein the second conductive electrode layer comprises a conductive polysilicon.

27. The method of claim 25, wherein the second conductive electrode layer comprises a conductive metal selected from the group consisting of tungsten, tungsten nitride, titanium nitride, and platinum.

28. The method of claim 24, wherein the step of forming the second conductive electrode layer comprises depositing a conductive material by chemical vapor deposition or physical vapor deposition.

29. The method of claim 2, wherein the dielectric layer comprises an insulating inorganic metal oxide material.

30. The method of claim 27, wherein the dielectric layer comprises a high K dielectric.

31. The method of claim 5, wherein the step of annealing comprises thermally annealing the polysilicon substrate.

32. The method of claim 5, wherein the step of annealing forms the oxynitride layer having a thickness of about 40 angstroms or less.

33. The method of claim 5, wherein the step of annealing forms the oxynitride layer having a thickness of less than about 15 angstroms.

34. The method of claim 5, wherein the nitridized oxynitride layer is effective to inhibit oxidation of the polysilicon substrate.

35. The method of claim 5, wherein the nitride layer is about 5 to about 15 angstroms thick.

36. The method of claim 5, wherein the oxynitride layer and the nitride layer have a combined thickness of about 10 to about 30 angstroms.

37. The method of claim 5, wherein the step of nitridizing comprises exposing the oxynitride layer to a remote plasma source of nitrogen.

38. The method of claim 5, further comprising saturating the dielectric layer with oxygen.

39. The method of claim 38, wherein the step of saturating comprises subjecting the dielectric layer to an oxygen anneal in an oxidizing gas.

40. The method of claim 39, wherein the oxygen anneal comprises annealing with one or more of oxygen, plasma oxygen, ozone, and nitrous oxide.

41. The method of claim 5, further comprising depositing a conductive material over the dielectric layer.

42. The method of claim 41, wherein the conductive material is selected from the group consisting of doped polysilicon, tungsten, tungsten nitride, titanium nitride, and platinum.

43. A method of forming a dielectric layer, comprising the steps of:
   annealing a polysilicon substrate in nitric oxide at a temperature of less than 800° C. to form an oxynitride layer on the polysilicon substrate;
   nitridizing the oxynitride layer to form a nitride layer on the oxynitride layer by exposing the oxynitride layer to a nitrogen-containing gas selected from the group consisting of a plasma mixture of nitrogen and helium, and a plasma mixture of nitrogen and argon; and depositing the dielectric layer onto the nitride layer.

44. The method of claim 43, wherein the step of nitridizing the oxynitride layer is at temperature of about 0 to about 900° C.

45. The method of claim 43, wherein the oxynitride layer and the nitride layer have a combined thickness of about 10 to about 40 angstroms.

46. A method of forming a dielectric layer, comprising the steps of:

annealing a polysilicon substrate in nitric oxide to form an oxynitride layer on the polysilicon substrate;

nitridizing the oxynitride layer to form a nitride layer on the oxynitride layer by exposure of the oxynitride layer to a plasma generated nitrogen species selected from the group consisting of a plasma mixture of nitrogen and helium and a plasma mixture of nitrogen and argon; and depositing a high K dielectric layer onto the nitride layer.

47. The method of claim 46, wherein the high K dielectric layer is selected from the group consisting of tantalum pentoxide, titanium dioxide, barium strontium titanate, strontium titanate, barium titanate, lead zirconium titanate, strontium bismuth tantalate, hafnium oxide, zirconium oxide, and aluminum oxide.

48. The method of claim 46, wherein the high K dielectric layer comprises tantalum pentoxide.

49. The method of claim 46, further comprising, after the step of forming the high K dielectric layer, annealing the high K dielectric layer in an oxidizing gas.

50. The method of claim 49, wherein the oxidizing gas is selected from the group consisting of oxygen, plasma oxygen, ozone, nitrous oxide, and mixtures thereof.

51. A method of forming a dielectric layer, comprising the steps of:

annealing a polysilicon substrate in nitric oxide at a temperature less than 800° C. to form an oxynitride layer on the polysilicon substrate;

nitridizing the oxynitride layer in a plasma generated nitrogen to form an nitride layer on the oxynitride layer, the plasma generated nitrogen gas selected from the group consisting of a plasma mixture of nitrogen and helium and a plasma mixture of nitrogen and argon;

depositing a high K dielectric layer onto the nitride layer; and annealing the high K dielectric layer in an oxidizing ambient.

52. The method of claim 51, wherein the step of annealing the polysilicon substrate is at a temperature of about 700 to about 750° C.

53. The method of claim 51, wherein the oxynitride layer has a thickness that is substantially the same before and after the step of annealing the high K dielectric layer.

54. The method of claim 51, wherein the oxynitride is about 40 angstroms or less.

55. The method of claim 51, wherein the oxynitride layer is less than 15 angstroms.

56. A method of forming a dielectric layer on a semiconductor substrate, comprising the steps of:

annealing a polysilicon substrate in nitric oxide at a temperature of less than 800° C. to form an oxide layer having a thickness of about 40 angstrom or less on the polysilicon substrate;

exposing the oxide layer to a plasma generated nitrogen gas to form a nitrided oxide layer on the oxide layer, the plasma generated nitrogen gas selected from the group consisting of a plasma mixture of nitrogen and helium and a plasma mixture of nitrogen and argon; and forming a high K dielectric layer over the nitrided oxide layer.

57. A method of forming a dielectric layer on a semiconductor substrate, comprising the steps of:

annealing a polysilicon substrate in nitric oxide at a temperature of about less than 800° C. to form an oxide layer having a thickness of about 40 angstroms or less on the polysilicon substrate;

exposing the oxide layer to a plasma generated nitrogen gas to form a nitrided oxide layer on the oxide layer, the plasma generated nitrogen gas selected from the group consisting of a plasma mixture of nitrogen and helium and a plasma mixture of nitrogen and argon;

forming a high K dielectric layer over the nitrided oxide layer; and annealing the high K dielectric layer in an oxidizing ambient;

whereby the thickness of the nitrided oxide layer after the step of annealing the high K dielectric layer is about 40 angstroms or less.

58. A method of forming a dielectric layer, comprising the steps of:

providing a polysilicon substrate;

heat treating the polysilicon substrate in nitric oxide to form a thin oxide layer over the polysilicon substrate;

exposing the thin oxide layer to a plasma generate nitrogen gas to form a nitride layer on the thin oxide layer; and forming a high K dielectric layer over the nitride layer on the thin oxide layer, the plasma generated nitrogen gas selected from the group consisting of plasma mixture of nitrogen and helium and a plasma mixture of nitrogen and argon.

59. A method of forming a dielectric layer, comprising the steps of:

providing a substrate comprising polysilicon;

forming an oxide layer over the polysilicon substrate by heat treating the polysilicon substrate in nitric oxide at a temperature of less than 800° C., such that nitrogen concentrates within the oxide layer at an interface between the oxide layer and the polysilicon substrate;

forming a nitride layer over the oxide layer by exposing the oxide layer to a plasma generated nitrogen gas the plasma generated nitrogen gas selected from the group consisting of a plasma mixture of nitrogen and helium and a plasma mixture of nitrogen and argon; and forming a high K dielectric layer over the nitride layer.

60. A method of forming a dielectric layer, comprising the steps of:

annealing a polysilicon substrate in nitric oxide at a temperature of less than 800° C. to form an oxynitride layer on the polysilicon substrate;

nitridizing the oxynitride layer to form a nitride layer on the oxynitride layer by exposing the oxynitride layer to an activated plasma generated nitrogen gas, the activated plasma generated nitrogen gas selected from the group consisting of a plasma mixture of nitrogen and helium and a plasma mixture of nitrogen and argon; and depositing the dielectric layer onto the nitride layer.

61. The method of claim 60, wherein the step of nitridizing the oxynitride layer is at a temperature of about 0 to about 900°C.

62. The method of claim 60, wherein the oxynitride layer and the nitride layer have a combined thickness of about 10 to about 40 angstroms.

63. A method of forming a dielectric layer, comprising the steps of:
annealing a polysilicon substrate in nitric oxide to form an oxynitride layer on the polysilicon substrate;
nitridizing the oxynitride layer in an activated plasma generated nitrogen gas to form a nitride layer on the oxynitride layer, the activated plasma generated nitrogen gas selected from the group consisting of a plasma mixture of nitrogen and helium and a plasma mixture of nitrogen and argon; and
depositing a high K dielectric layer onto the nitride layer.

64. A method of forming a dielectric layer on a semiconductor substrate, comprising the steps of:
providing a substrate comprising HSG polysilicon;
annealing the HSG polysilicon in nitric oxide at a temperature of about 700° C. to about 750° C. to form an oxide layer having a thickness of about 40 angstroms or less on the HSG polysilicon;
exposing the oxide layer to a plasma generated nitrogen gas to form a nitrided oxide layer on the oxide layer, the plasma generated nitrogen gas selected from the group consisting of a plasma mixture of nitrogen and helium and a plasma mixture of nitrogen and argon;
forming a layer comprising tantalum pentoxide over the nitrided oxide layer; and
annealing the tantalum pentoxide layer in an oxidizing ambient;
whereby the thickness of the nitrided oxide layer is about 40 angstroms or less.

65. A method of forming a dielectric layer on a semiconductor substrate, comprising the steps of:
providing a substrate comprising HSG polysilicon;
annealing the HSG polysilicon in nitric oxide at a temperature of about 700° C. to about 750° C. to form an oxide layer having a thickness of about 40 angstroms or less on the HSG polysilicon;
exposing the oxide layer to an activated plasma generated nitrogen gas to form a nitrided oxide layer on the oxide layer, the activated plasma generated nitrogen gas selected from the group consisting of a plasma mixture of nitrogen and helium and a plasma mixture of nitrogen and argon;
forming a layer comprising tantalum pentoxide over the nitrided oxide layer; and
annealing the tantalum pentoxide layer in an oxidizing ambient;
whereby the thickness of the nitrided oxide layer is about 40 angstroms or less.

66. A method of forming a semiconductor device above a semiconducting substrate having a surface, comprising the steps of:
forming a nitrided oxynitride layer over a polysilicon substrate by annealing the polysilicon substrate in the presence of a nitric oxide at a temperature of about 700 to about 750° C. to form an oxynitride layer, and nitridizing the oxynitride layer in a plasma generated nitrogen gas to form the nitrided oxynitride layer on the oxynitride layer, the plasma generated nitrogen gas selected from the group consisting of a plasma mixture of nitrogen and helium and a plasma mixture of nitrogen and argon; the nitrided oxynitride layer having a thickness of about 40 angstroms or less; and
forming a dielectric layer over the nitrided oxynitride layer.

67. The method of claim 66, wherein the dielectric layer comprises a high K dielectric.

68. The method of claim 67, wherein the high K dielectric is selected from the group consisting of tantalum pentoxide, titanium dioxide, barium strontium titanate, strontium titanate, barium titanate, lead zirconium titanate, strontium bismuth tantalate, hafnium oxide, zirconium oxide, and aluminum oxide.

69. The method of claim 67, wherein the dielectric layer comprises tantalum pentoxide.

70. The method of claim 67, further comprising, after the step of forming the dielectric layer, annealing the dielectric layer in an oxidizing gas, wherein the thickness of the nitrided oxynitride layer is about 40 angstroms or less.

71. The method of claim 70, wherein the oxidizing gas is selected from the group consisting of oxygen, plasma oxygen, ozone, nitrous oxide, and mixtures thereof.

72. A method of forming a semiconductor device above a semiconducting substrate having a surface, comprising the steps of:
forming a nitrided oxynitride layer over a polysilicon substrate by annealing the polysilicon substrate in the presence of a nitric oxide at a temperature of about 700 to about 750° C. to form an oxynitride layer, and nitridizing the oxynitride layer in an activated plasma generated nitrogen gas to form the nitrided oxynitride layer on the oxynitride layer, the activated plasma generated nitrogen gas selected from the group consisting of a plasma mixture of nitrogen and helium and a plasma mixture of nitrogen and argon; the nitrided oxynitride layer having a thickness of about 40 angstroms or less; and
forming a dielectric layer over the nitrided oxynitride layer.

73. The method of claim 72, wherein the dielectric layer comprises a high K dielectric.

74. A method of forming a dielectric layer in a capacitor container comprising an opening formed in an insulative layer and a lower electrode comprising polysilicon formed within the opening, the method comprising the steps of:
forming an oxynitride layer over the lower electrode by annealing the lower electrode in the presence of nitric oxide;
nitridizing the oxynitride layer in a plasma generated nitrogen gas to form a nitrided oxynitride layer on the oxynitride layer, the plasma generated nitrogen gas selected from the group consisting of a plasma mixture of nitrogen and helium and a plasma mixture of nitrogen and argon; and
forming a high K dielectric layer over the nitrided oxynitride layer.

75. The method of claim 74, wherein the step of annealing the lower electrode is at a temperature of about 700 to about 750° C.

76. The method of claim 74, further comprising annealing the high K dielectric layer in an oxidizing ambient.

77. A method of forming a dielectric layer in a capacitor container comprising an opening formed in an insulative layer and a lower electrode comprising polysilicon formed within the opening, the method comprising the steps of:
forming an oxynitride layer over the lower electrode by annealing the lower electrode in the presence of nitric oxide;
nitridizing the oxynitride layer in an activated plasma generated nitrogen gas to form a nitrided oxynitride layer on the oxynitride layer, the activated plasma generated nitrogen gas selected from the group consisting of a plasma mixture of nitrogen and helium and a plasma mixture of nitrogen and argon; and forming a high K dielectric layer over the nitrided oxynitride layer.

78. The method of claim 77, wherein the step of annealing the lower electrode is at a temperature of about 700 to about 750° C.

79. A method of forming a capacitor, comprising the steps of:
forming a first capacitor electrode comprising polysilicon over a substrate;
forming an oxynitride layer over the first capacitor electrode by annealing the first capacitor electrode in the presence of nitric oxide;
nitridizing the oxynitride layer in a plasma generated nitrogen gas to form a nitrided oxynitride layer on the oxynitride layer, the plasma generated nitrogen gas selected from the group consisting of a plasma mixture of nitrogen and helium and a plasma mixture of nitrogen and argon; and
forming a dielectric layer over the nitrided oxynitride layer.

80. The method of claim 79, wherein the dielectric layer comprises a high K dielectric material.

81. The method of claim 80, wherein the high K dielectric material is selected from the group consisting of tantalum pentoxide, titanium dioxide, barium strontium titanate, strontium titanate, barium titanate, lead zirconium titanate, strontium bismuth tantalate, hafnium oxide, zirconium oxide, and aluminum oxide.

82. The method of claim 80, wherein the dielectric layer comprises tantalum pentoxide.

83. The method of claim 80, further comprising, after the step of forming the dielectric layer, annealing the dielectric layer in an oxidizing gas.

84. A method of forming a capacitor, comprising the steps of:
forming a first capacitor electrode comprising polysilicon over a substrate;
forming an oxynitride layer over the first capacitor electrode by annealing the first capacitor electrode in the presence of nitric oxide;
nitridizing the oxynitride layer in an activated plasma generated nitrogen gas to form a nitrided oxynitride layer on the oxynitride layer, the activated plasma generated nitrogen gas selected from the group consisting of a plasma mixture of nitrogen and helium and a plasma mixture of nitrogen and argon; and
forming a dielectric layer over the nitrided oxynitride layer.

85. A method of forming a capacitor, comprising the steps of:
providing a substrate comprising an overlying insulative layer and a container opening formed in the insulating layer to an active area on the substrate, and a lower electrode comprising polysilicon formed within the container opening;
forming an oxynitride layer over the lower electrode by annealing the lower electrode in the presence of nitric oxide;
nitridizing the oxynitride layer in a plasma generated nitrogen gas to form a nitrided oxynitride layer on the oxynitride layer, the plasma generated nitrogen gas selected from the group consisting of a plasma mixture of nitrogen and helium and a plasma mixture of nitrogen and argon;

forming a high K dielectric layer over the nitrided oxynitride layer; and
annealing the high K dielectric layer in an oxidizing gas.

86. The method of claim 85, wherein the step of forming the oxynitride layer comprises:
annealing the lower electrode in the presence of nitric oxide at a temperature of less than 800° C. to form the oxynitride layer having a thickness about 40 angstroms or less.

87. A method of forming a capacitor, comprising the steps of:
providing a substrate comprising an overlying insulative layer and a container opening formed in the insulating layer to an active area on the substrate, and a lower electrode comprising polysilicon formed within the container openings;
forming an oxynitride layer over the lower electrode by annealing the lower electrode in the presence of nitric oxide;
nitridizing the oxynitride layer in an activated plasma generated nitrogen gas to form a nitrided oxynitride layer on the oxynitride layer, the activated plasma generated nitrogen gas selected from the group consisting of a plasma mixture of nitrogen and helium and a plasma mixture of nitrogen and argon;
forming a high K dielectric layer over the nitrided oxynitride layer; and
annealing the high K dielectric layer in an oxidizing gas.

88. A method of forming a capacitor in a semiconductor device, comprising the steps of:
providing a substrate with an opening;
forming a first conductive electrode layer within the opening; the first conductive electrode layer comprising hemispherical grain polysilicon;
forming a thin layer of oxynitride over the first conductive electrode layer by annealing the first conductive electrode layer in the presence of nitric oxide;
nitridizing the thin layer of oxynitride in a plasma generated nitrogen gas to form a nitrided oxynitride layer an the thin layer of oxynitride, the plasma generated nitrogen gas selected from the group consisting of a plasma mixture of nitrogen and helium and a plasma mixture of nitrogen and argon;
forming an insulative layer over the nitrided oxynitride layer; the insulative layer comprising an insulating inorganic metal oxide material; and
forming a second conductive electrode layer over the insulative layer.

89. The method of claim 88, wherein the insulating inorganic metal oxide material comprises a high K dielectric.

90. The method of claim 89, wherein the insulating inorganic metal oxide material is selected from the group consisting of tantalum pentoxide, titanium dioxide, barium strontium titanate, strontium titanate, barium titanate, lead zirconium titanate, strontium bismuth tantalate, hafnium oxide, zirconium oxide, and aluminum oxide.

91. The method of claim 89, wherein the insulating inorganic metal oxide material comprises tantalum pentoxide.

92. The method of claim 88, further comprising, after the step of forming the insulative layer, annealing the insulative layer in an oxidizing gas.

93. The method of claim 88, wherein the step of forming the thin layer of oxynitride comprises:
annealing the first conductive electrode layer comprising hemispherical grain polysilicon in the presence of nitric oxide at a temperature of about 700 to about 750° C. to form an oxynitride layer having a thickness of about 40 angstroms or less.

94. A method of forming a dielectric layer, comprising the steps of:
thermally annealing a polysilicon substrate in nitric oxide to form an oxide layer on the polysilicon substrate; and
annealing the oxide layer in a plasma generated nitrogen gas to nitridize the oxide layer to form a nitride oxide layer on the oxide layer, the plasma generated nitrogen gas selected from the group consisting of a plasma mixture of nitrogen and helium and a plasma mixture of nitrogen and argon;
wherein upon forming the dielectric layer over the nitridized oxide layer, and exposing the dielectric layer to an oxidizing gas, the nitridized oxide layer inhibits oxidation of the polysilicon substrate.

95. A method of forming a dielectric layer, comprising the steps of:
thermally annealing a polysilicon substrate in nitric oxide to form an oxide layer on the polysilicon substrate;
annealing the oxide layer in a plasma generated nitrogen gas to nitridize the oxide layer to from a nitrided layer on the oxide layer, the plasma generated nitrogen gas selected from the group consisting of a plasma mixture of nitrogen and helium and plasma mixture of nitrogen and argon; and
forming the dielectric layer over, the nitridized oxide layer,
wherein upon exposing the dielectric layer to an oxidizing gas, the nitridized oxide layer inhibits oxidation of the polysilicon substrate.

96. A method of forming a dielectric layer, comprising the steps of:
thermally annealing a polysilicon substrate in nitric oxide to form an oxide layer on the polysilicon substrate;
annealing the oxide layer in a plasma generated nitrogen gas to nitridize the oxide layer to form a nitrided oxide layer on the oxide layer, the plasma generated nitrogen gas selected from the group consisting of a plasma mixture of nitrogen and helium and a plasma mixture of nitrogen and argon;
forming the dielectric layer over the nitridized oxide layer; and
exposing the dielectric layer to an oxidizing gas;
whereupon the nitridized oxide layer inhibits oxidation of the polysilicon substrate.

97. A method of forming a dielectric layer, comprising the steps of:
thermally annealing a polysilicon substrate in nitric oxide to form an oxide layer on the polysilicon substrate; and
plasma annealing the oxide layer in a plasma generated nitrogen gas to form a nitride layer on the oxide layer, the plasma generated nitrogen gas selected from the group consisting of a plasma mixture of nitrogen and helium and a plasma mixture of nitrogen and argon;
wherein upon forming the dielectric layer over the nitride layer, and exposing the dielectric layer to an oxidizing gas, the nitride layer inhibits oxidation of the polysilicon substrate.

98. A method of forming a dielectric layer, comprising the steps of:
thermally annealing a polysilicon substrate in nitric oxide to form an oxide layer on the polysilicon substrate;
plasma annealing the oxide layer in a plasma generated nitrogen gas to form a nitride layer on the oxide layer, the plasma generated nitrogen gas selected from the group consisting of a plasma mixture of nitrogen and helium and a plasma mixture of nitrogen and argon; and
forming the dielectric layer over the nitride layer;
wherein upon exposing the dielectric layer to an oxidizing gas, the nitride layer inhibits oxidation of the polysilicon substrate.

99. A method of forming a dielectric layer, comprising the steps of:
thermally annealing a polysilicon substrate in the presence of nitric oxide at a temperature of less than about 800° C. to form an oxide layer having a thickness of about 40 angstroms or less on the polysilicon substrate; and
annealing the oxide layer in a plasma generated nitrogen gas to nitridize the oxide layer to form a nitridized oxide layer on the oxide layer, the plasma generated nitrogen gas selected from the group consisting of a plasma mixture of nitrogen and helium and a plasma mixture of nitrogen and argon;
wherein upon forming a high K dielectric layer over the nitridized oxide layer, and exposing the dielectric layer to an oxidizing gas, the nitridized oxide layer inhibits oxidation of the polysilicon substrate.

100. A method of forming a dielectric layer, comprising the steps of:
thermally annealing a polysilicon substrate in the presence of nitric oxide at a temperature of less than about 800° C. to form an oxide layer having a thickness of about 40 angstroms or less on the polysilicon substrate;
annealing the oxide layer in a plasma generated nitrogen gas to nitridize the oxide layer to form a nitridized oxide layer on the oxide layer, the plasma generated nitrogen gas selected from the group consisting of a plasma mixture of nitrogen and helium and a plasma mixture of nitrogen and argon; and
forming a high K dielectric layer over the nitridized oxide layer;
wherein upon exposing the high K dielectric layer to an oxidizing gas, the nitridized oxide layer inhibits oxidation of the polysilicon substrate.

101. A method of forming a dielectric layer, comprising the steps of
thermally annealing a polysilicon substrate in the presence of nitric oxide at a temperature of less than about 800° C. to form an oxynitride layer having a thickness of about 40 angstroms or less on the polysilicon substrate;
annealing the oxynitride layer to form a nitridized oxynitride layer on the oxynitride layer in a plasma generated nitrogen gas selected from the group consisting of a plasma mixture of nitrogen and helium and a plasma mixture of nitrogen and argon;
forming a high K dielectric layer over the nitridized oxynitride layer; and
annealing the high K dielectric layer in an oxidizing gas;
wherein the nitridized oxynitride layer inhibits oxidation of the polysilicon substrate.

102. A method of forming a dielectric layer, comprising the steps of:
thermally annealing a polysilicon substrate in the presence of nitric oxide at a temperature of less than about 800° C. to form an oxynitride layer having a thickness of about 40 angstroms or less on the polysilicon substrate;
annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

forming a high K dielectric layer over the nitridized oxynitride layer; and annealing the high K dielectric layer in an oxidizing gas;

wherein the nitridized oxynitride layer inhibits oxidation of the polysilicon substrate.

103. A method of forming a dielectric layer, comprising the steps of:

exposing a polysilicon substrate to nitric oxide at a temperature of less than about 800° C. to form an oxynitride layer having a thickness of about 40 angstroms or less on the polysilicon substrate;

exposing the oxynitride layer to a plasma source of nitrogen to nitridize the oxynitride layer to form a nitridized oxynitride layer on the oxynitride layer, the plasma source of nitrogen comprises a plasma mixture of nitrogen and argon or a plasma mixture of nitrogen and helium;

forming a high K dielectric layer over the nitridized oxynitride layer; and exposing the high K dielectric layer in an oxidizing gas;

wherein the nitridized oxynitride layer inhibits oxidation of the polysilicon substrate.

104. A method of forming a dielectric layer, comprising the steps of:

thermally annealing a polysilicon substrate in the presence of nitric oxide at a temperature of less than about 800° C. to form an oxynitride layer having a thickness of less than about 15 angstroms on the polysilicon substrate;

annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon; and forming a high K dielectric layer over the nitridized oxynitride layer;

wherein upon exposing the high K dielectric layer to an oxidizing gas, the nitridized oxynitride layer inhibits oxidation of the polysilicon substrate.

105. A method of forming a dielectric layer, comprising the steps of:

thermally annealing a polysilicon substrate in the presence of nitric oxide at a temperature of less than about 800° C. to form an oxynitride layer having a thickness of less than about 15 angstroms on the polysilicon substrate;

annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

forming a high K dielectric layer over the nitridized oxynitride layer; and annealing the high K dielectric layer in an oxidizing gas;

wherein the nitridized oxynitride layer inhibits oxygen diffusion into the polysilicon layer.

106. A method of forming a dielectric layer, comprising the steps of:

exposing a polysilicon substrate to nitric oxide at a temperature of less than about 800° C. to form an oxynitride layer on the polysilicon substrate; and exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

wherein upon forming the dielectric layer over the nitridized oxynitride layer, and exposing the dielectric layer to an oxidizing gas, the nitridized oxynitride layer inhibits oxidation of the polysilicon substrate.

107. A method of forming a dielectric layer, comprising the steps of:

exposing a polysilicon substrate to nitric oxide at a temperature of less than about 800° C. to form an oxynitride layer on the polysilicon substrate;

exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and plasma mixture of nitrogen and argon; and forming the dielectric layer over the nitridized oxynitride layer;

wherein upon exposing the dielectric layer to an oxidizing gas, the nitridized oxynitride layer inhibits oxidation of the polysilicon substrate.

108. A method of forming a dielectric layer, comprising the steps of:

exposing a polysilicon substrate to nitric oxide at a temperature of less than about 800° C. to form an oxynitride layer on the polysilicon substrate;

exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

forming the dielectric layer over the nitridized oxynitride layer, and exposing the dielectric layer to an oxidizing gas;

wherein the nitridized oxynitride layer inhibits oxidation of the polysilicon substrate.

109. A method of forming a dielectric layer, comprising the steps of:

exposing a polysilicon substrate to nitric oxide at a temperature of less than about 800° C. to form an oxynitride layer having a thickness of less than about 40 angstroms on the polysilicon substrate; and exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

wherein upon forming a high K dielectric layer over the nitridized oxynitride layer; and exposing the high K dielectric layer to an oxidizing gas, the nitridized oxynitride layer inhibits oxidation of the polysilicon substrate.

110. A method of forming a dielectric layer in a capacitor container, the capacitor container comprising an opening in an insulative layer and a conductive polysilicon lower electrode disposed within the opening, the method comprising the steps of:

exposing the conductive polysilicon lower electrode to nitric oxide at a temperature of less than about 800° C.

to form an oxynitride layer having a thickness of less than about 15 angstroms on the polysilicon substrate;

exposing the oxynitride layer to a plasma generated nitrogen gas to nitridize the oxynitride layer to form nitridized oxynitride layer on the oxynitride layer, the plasma generated nitrogen gas selected from the group consisting of a plasma mixture of nitrogen and helium and a plasma mixture of nitrogen and argon;

forming a high K dielectric layer over the nitridized oxynitride layer; and exposing the high K dielectric layer to an oxidizing gas;

wherein the nitridized oxynitride layer inhibits oxidation of the conductive polysilicon lower electrode.

111. A method of forming a capacitor, comprising the steps of:

forming a first electrode over a substrate, the first electrode comprising polysilicon;

exposing the first electrode to nitric oxide at a temperature of less than about 800° C. to form an oxynitride layer thereon having a thickness of about 40 angstroms or less; and exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

wherein upon forming a high K dielectric layer over the nitridized oxynitride layer, and exposing the high K dielectric layer to an oxidizing gas, the nitridized oxynitride layer inhibits oxidation of the first electrode.

112. A method of forming a capacitor, comprising the steps of:

forming a first electrode over a substrate, the first electrode comprising polysilicon;

exposing the first electrode to nitric oxide at a temperature of less than about 80020 C. to form an oxynitride layer thereon having a thickness of about 40 angstroms or less;

exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

forming a high K dielectric layer over the nitridized oxynitride layer; and exposing the high K dielectric layer to an oxidizing gas;

wherein the nitridized oxynitride layer inhibits oxidation of the first electrode.

113. A method of forming a capacitor, comprising the steps of:

forming a first electrode over a substrate, the first electrode comprising polysilicon;

thermally annealing the first electrode in the presence of nitric oxide at a temperature of less than about 800° C. to form an oxynitride layer thereon having a thickness of less than about 15 angstroms; and annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

wherein upon forming a high K dielectric layer over the nitridized oxynitride layer, and annealing the high K dielectric layer in an oxidizing gas, the nitridized oxynitride layer inhibits oxidation of the polysilicon electrode.

114. A method of forming a capacitor, comprising the steps of:

forming a first electrode over a substrate, the first electrode comprising polysilicon;

thermally annealing the first electrode in the presence of nitric oxide at a temperature of less than about 800° C. to form an oxynitride layer thereon having a thickness of less than about 15 angstroms;

annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen of nitrogen and helium and a plasma mixture of nitrogen and argon;

forming a high K dielectric layer over the nitridized oxynitride layer; and annealing the high K dielectric layer in an oxidizing gas, wherein the nitridized oxynitride layer inhibits oxidation of the polysilicon electrode.

115. The method of claim 114, further comprising the step of forming a second electrode over the high K dielectric layer, the second electrode comprising a conductive material.

116. The method of claim 114, wherein the first electrode comprises HSG polysilicon.

117. The method of claim 115, wherein the second electrode comprises a conductive polysilicon or a conductive metal.

118. The method of claim 117, wherein the second electrode comprises a conductive metal selected from the group consisting of tungsten, tungsten nitride, titanium nitride, and platinum.

119. The method of claim 115, wherein the step of forming the second electrode comprises depositing the conductive material by chemical vapor deposition or physical vapor deposition.

120. A method of forming a capacitor, comprising the steps of:

providing a substrate, an overlying insulative layer, and a first electrode comprising polysilicon-within an opening extending through the insulative layer to the substrate;

exposing the first electrode to nitric oxide at a temperature of less than about 800° C. to form an oxynitride layer thereon having a thickness of about 40 angstroms or less; and exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

wherein upon forming a high K dielectric layer over the nitridized oxynitride layer, and exposing the high K dielectric layer to an oxidizing gas, the nitridized oxynitride layer inhibits oxidation of the first electrode.

121. A method of forming a capacitor, comprising the steps of:

providing a substrate, an overlying insulative layer, and a first electrode comprising polysilicon-within an opening extending through the insulative layer to the substrate;

thermally annealing the first electrode in the presence of nitric oxide at a temperature of less than about 800° C.

to form an oxynitride layer thereon having a thickness of about 40 angstroms or less; and annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and plasma mixture of nitrogen and argon;

wherein upon forming a high K dielectric layer over the nitridized oxynitride layer, and annealing the high K dielectric layer in an oxidizing gas, the nitridized oxynitride layer inhibits oxidation of the first electrode.

122. A method of forming a capacitor, comprising the steps of:

providing a substrate, an overlying insulative layer, and a first electrode comprising polysilicon an opening extending through the insulative layer to the substrate;

thermally annealing the first electrode in the presence of nitric oxide at a temperature of less than about 800° C. to form an oxynitride layer thereon having a thickness of about 40 angstroms or less;

annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture and argon;

forming a high K dielectric layer over the nitridized oxynitride layer;

annealing the high K dielectric layer in an oxidizing gas, wherein the nitridized oxynitride layer inhibits oxidation of the first electrode; and forming a second electrode over the high K dielectric layer, the second electrode comprising a conductive material.

123. A method of forming a capacitor, comprising the steps of:

providing a substrate with an overlying insulative layer and an opening extending through the insulative layer to the substrate;

forming a first electrode comprising polysilicon-within the opening;

exposing the first electrode to nitric oxide at a temperature of less than about 80020 C. to form an oxynitride layer thereon having a thickness of about 40 angstroms or less; and exposing the oxynitride layer to a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

wherein upon forming a high K dielectric layer over the nitridized oxynitride layer, and exposing the high K dielectric layer to an oxidizing gas, the nitridized oxynitride layer inhibits oxidation of the first electrode.

124. A method of forming a capacitor, comprising the steps of:

providing a substrate with an overlying insulative layer and an opening extending through the insulative layer to the substrate;

forming a first electrode comprising polysilicon-within the opening;

thermally annealing the first electrode in the presence of nitric oxide at a temperature of less than about 80020 C. to form an oxynitride layer thereon having a thickness of about 40 angstroms or less; and annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

wherein upon forming a high K dielectric layer over the nitridized oxynitride layer, and annealing the high K dielectric layer in an oxidizing gas, the nitridized oxynitride layer inhibits oxidation of the first electrode.

125. A method of forming a capacitor, comprising the steps of:

providing a substrate with an overlying insulative layer and an opening extending through the insulative layer to the substrate;

forming a first electrode comprising polysilicon-within the opening;

thermally annealing the first electrode in the presence of nitric oxide at a temperature of less than about 800° C. to form an oxynitride layer thereon having a thickness of about 40 angstroms or less;

annealing the oxynitride layer in a plasma generated nitrogen gas to nitridize the oxynitride layer to form a nitridized oxynitride layer on the oxynitride layer, the plasma generated nitrogen gas selected from the group consisting of a plasma mixture of nitrogen and helium and a plasma mixture of nitrogen and argon;

forming a high K dielectric layer over the nitridized oxynitride layer;

annealing the high K dielectric layer in an oxidizing gas, wherein the nitridized oxynitride layer inhibits oxidation of the first electrode; and forming a second electrode over the high K dielectric layer, the second electrode comprising a conductive material.

126. A method of forming a dielectric layer, comprising the steps of:

annealing a polysilicon substrate in nitric oxide at a temperature of less than 800° C. to form an oxide layer on the polysilicon substrate;

nitridizing the oxide layer after the step of annealing in a plasma generated nitrogen gas to form a silicon nitride layer on the oxide layer, the plasma generated nitrogen gas selected from the group consisting of a plasma mixture of nitrogen and helium and a plasma mixture of nitrogen and argon; and depositing the dielectric layer onto the silicon nitride layer.

127. A method of forming a dielectric layer, comprising the steps of:

annealing a polysilicon substrate in nitric oxide at a temperature of less than 800° C. to form an oxide layer on the polysilicon substrate;

nitridizing the oxide layer after the step of annealing in a plasma generated nitrogen gas to form a silicon nitride layer on oxide layer, the plasma generated nitrogen gas selected form the group consisting of a plasma mixture of nitrogen and helium and a plasma mixture of nitrogen and argon;

depositing the dielectric layer onto the silicon nitride layer; and exposing the dielectric layer to an oxidizing gas, wherein oxidation of the polysilicon substrate is inhibited.

* * * * *

UNITED STATES PATENT AND TRADEMARK OFFICE
CERTIFICATE OF CORRECTION

PATENT NO.        : 7,129,128 B2
APPLICATION NO. : 09/941827
DATED             : October 31, 2006
INVENTOR(S)       : Ronald A. Weimer It is certified that error appears in the above-identified patent and that said Letters Patent is hereby corrected as shown below:

Column 5, line 61:  Replace "100" with --1mTorr--.
Column 6, line 55:  Replace "fanning" with --forming--.
Column 7, line 11:  Replace "oxide" with --oxynitride--.
Column 15, line 9:  Replace "nitride" with --nitrided--.
Column 15, line 23: After "nitrided" insert --oxide--.
Column 19, line 37: Replace "80020 C" with --800°C--.
Column 21, line 44: Replace "80020 C" with --800°C--.
Column 21, line 65: Replace "80020" with --800°--.
Column 22, line 59: Replace "form" with --from--.

Signed and Sealed this

Sixth Day of November, 2007

JON W. DUDAS
*Director of the United States Patent and Trademark Office*